United States Patent [19]
Gregor et al.

[11] Patent Number: 6,023,093
[45] Date of Patent: Feb. 8, 2000

[54] DEUTERATED DIRELECTRIC AND POLYSILICON FILM-BASED SEMICONDUCTOR DEVICES AND METHOD OF MANUFACTURE THEREOF

[75] Inventors: Richard W. Gregor, Winter Park; Isik C. Kizilyalli, Orlando, both of Fla.

[73] Assignee: Lucent Technologies Inc., Murray Hill, N.J.

[21] Appl. No.: 08/847,704

[22] Filed: Apr. 28, 1997

[51] Int. Cl.$^7$ .................................................. H01L 23/58
[52] U.S. Cl. .................. 257/632; 257/327; 257/405; 257/410; 257/651
[58] Field of Search .................................. 257/632, 162, 257/327, 324, 325, 326, 333, 339, 337, 338, 428, 429, 651, 402, 405, 410; 136/258

[56] References Cited

U.S. PATENT DOCUMENTS

| | | | |
|---|---|---|---|
| 4,268,321 | 5/1981 | Meguro | 148/1.5 |
| 4,268,951 | 5/1981 | Elliott et al. | 257/327 |
| 4,620,211 | 10/1986 | Baliga et al. | 257/142 |
| 5,248,348 | 9/1993 | Miyachi et al. | 136/258 |
| 5,264,724 | 11/1993 | Brown et al. | 257/347 |
| 5,304,830 | 4/1994 | Sato | 257/338 |
| 5,378,541 | 1/1995 | Ihara et al. | 428/428 |
| 5,642,014 | 6/1997 | Hillenius | 257/429 |
| 5,830,575 | 11/1998 | Warren et al. | 428/404 |

OTHER PUBLICATIONS

Sze, S.M., Physics of Semiconductor Devices, 2nd edition, John Wiley, 1981, p. 850.

I.C. Kizilyalli, J.W. Lyding and K. Hess, Deuterium Post-–Metal Annealing of MOSFET's for Improved Hot Carrier Reliability, IEEE Electron Device Letters, vol. 18, No. 3, pp. 81–83 (Mar. 1997).

*Primary Examiner*—Sara Crane

[57] ABSTRACT

A semiconductor device and a method of manufacturing the semiconductor device. The device includes: (1) a substrate composed at least in part of silicon and (2) a film located over the substrate and having a substantial concentration of an isotope of hydrogen located in the film.

9 Claims, 3 Drawing Sheets

DEUTERATED DIRELECTRIC AND POLYSILICON FILM-BASED SEMICONDUCTOR DEVICES AND METHOD OF MANUFACTURE THEREOF

TECHNICAL FIELD OF THE INVENTION

The present invention is directed, in general, to a semiconductor device and, more specifically, to a semiconductor device containing a dielectric and polysilicon film in which the film is exposed to deuterium while the device is being fabricated and a method of manufacture of such a device.

BACKGROUND OF THE INVENTION

The use of silicon in devices such as semiconductor devices is well known. Equally well known is the time dependent degradation of these devices, which is often referred to as the hot carrier degradation effect. It is believed that this degradation is caused by defects that are generated by current flow in the semiconductor device. It is further believed that these defect states reduce the mobility and lifetime of the carriers and cause degradation of the device's performance. In most cases, the substrate comprises silicon, and the defects are thought to be caused by dangling bonds (i.e., unsaturated silicon bonds) that introduce states in the energy gap, which remove charge carriers or add unwanted charge carriers in the device, depending in part on the applied bias. While dangling bonds occur primarily at surfaces or interfaces in the device, they also are thought to occur at vacancies, micropores, dislocations, and are also thought to be associated with impurities. To alleviate the problems caused by such dangling bonds, a hydrogen passivation process has been adopted and has become a well-known and established practice in the fabrication of such devices.

In the hydrogen passivation process, it is thought that the defects that affect the operation of semiconductor devices are removed when the hydrogen bonds with the silicon at the dangling bond sites. While the hydrogen passivation process eliminates the immediate problem associated with these dangling bonds, it does not eliminate degradation permanently because the hydrogen atoms that are added by the passivation process can be "desorbed" or removed from the previous dangling bond sites by the "hot carrier effect."

A hot carrier is an electron or hole that has a high kinetic energy, which is imparted to it when voltages are applied to electrodes of the device. Under such operating conditions, the hydrogen atoms, which were added by the hydrogen passivation process, are knocked off by the hot electrons. This hydrogen desorption results in aging or degradation of the device's performance. According to established theory, this aging process occurs as the result of hot carriers stimulating the desorption of hydrogen from the silicon substrate's surface or the silicon dioxide interface. This hot carrier effect is particularly of concern with respect to smaller devices.

Accordingly, what is needed in the art is a semiconductor device and a method of manufacture therefore that does experience the level of efficiency degradation experienced by the devices that are passivated with conventional hydrogen passivation processes. The present invention addresses these needs.

SUMMARY OF THE INVENTION

To address the above-discussed deficiencies of the prior art, the present invention provides a semiconductor device and a method of manufacturing the semiconductor device. The device includes: (1) a substrate and (2) a film or layer located over the substrate and having a substantial concentration of an isotope of hydrogen located in the film.

The present invention therefore introduces the broad concept of employing, in lieu of hydrogen, an isotope of hydrogen to passivate a film. For purposes of the present invention, "substantial concentration" is defined as a concentration of at least $10^{16}$ cm$^{-3}$ of isotopic hydrogen.

In one embodiment of the present invention, the isotope is deuterium, however, the principles of the present invention may be applied to heavier isotopes of hydrogen.

In another embodiment of the present invention, the film is selected from the group consisting of: (1) a dielectric film and (2) a polysilicon film. The dielectric film may be composed of silicon dioxide, which can be formed either by deposition or thermal growth, or it may be another nitrogen dielectric. The polysilicon film may be composed of a material selected from the group consisting of: (1) polycrystalline silicon and amorphous silicon.

In one embodiment of the present invention, the device is a submicron silicon transistor. In another aspect of this particular embodiment, the submicron transistor may be a complementary metal oxide semiconductor, a Bipolar-complementary metal oxide semiconductor transistor (BiCMOS) or a flash erasable programmable read only memory (EPROM). Those who are skilled in the art will perceive other advantageous uses for the present invention.

In yet another embodiment, the substrate contains at least one doped region. Those who are skilled in the art will understand that the present invention is employable to form semiconductor devices having one or more doped regions therein.

In yet another embodiment of the present invention, the device further comprises a gate, a field oxide and a spacer (gate side-wall), each of which contains a substantial concentration of an isotope of hydrogen.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
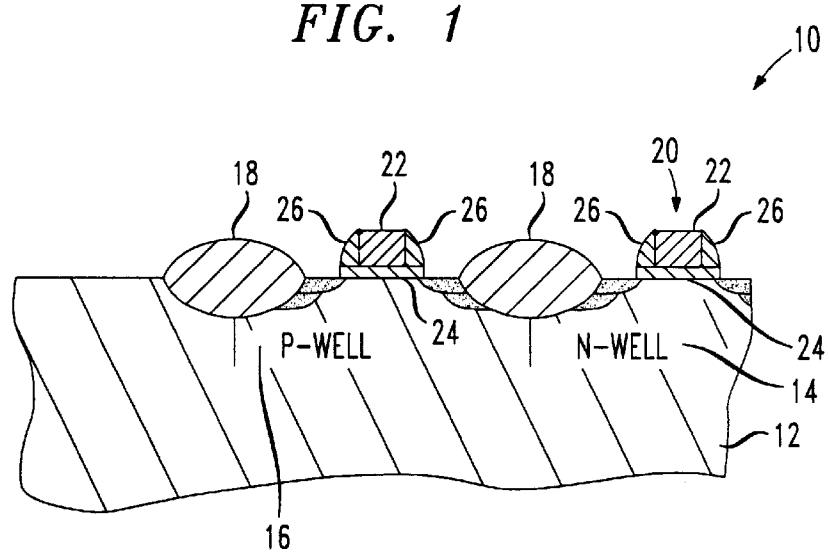
FIG. 1 illustrates a schematic cross-sectional view of semiconductor device after the formation of the gates and spacers.

Referring initially to FIG. 1, there is illustrated a schematic, cross-sectional view of a semiconductor device 10 of the present invention. In advantageous embodiments, the semiconductor 10 comprises a substrate 12 with n-well and p-well regions 14 and 16, respectively, formed therein in a conventional manner. The substrate may comprise silicon, germanium, gallium arsenide or other presently known or later-discovered materials that are suitable for the manufacture of such semiconductor devices. In one desirable embodiment, however, the substrate 12 is composed at least in part of silicon.

In a more desirable embodiment, the semiconductor 10 includes a dielectric structure 18. The dielectric structure 18 is preferably a field oxide that contains a substantial concentration of a hydrogen isotope. The dielectric structure 18 is thermally grown in the presence of a deuterated steam ($D_2O$) or other isotopic steam of hydrogen. For purposes of the present invention, the isotopic steam should have as high a concentration of the hydrogen isotope as possible. In more advantageous embodiments, the nonisotopic hydrogen should not exceed 1 ppm within the steam. In one advantageous embodiment, the isotope is deuterium, however, the principles of the present invention may be applied to even heavier isotopes of hydrogen, including ionic forms of the various isotopes of hydrogen. Most likely, the isotope is covalently bonded to the amorphous silicon. Alternative bonding structures may exist, however, and as such, the present invention is independent of the type of bond between the isotope and the amorphous silicon.

Alternatively, the dielectric structure 18 may be chemically deposited from a gas mixture containing a substantial concentration of a hydrogen isotope, such as deuterium. For purposes of the present invention, "substantial concentration" is defined as a concentration of at least about $10^{16}$ cm$^{-3}$ of isotopic hydrogen. Representative examples of such gases and gas mixtures include: deuterated silane and oxygen ($SiD_4+O_2$), deuterated silane and nitrous oxide ($SiD_4+N_2O$), deuterated tetraethyl orthosilicate (TEOS, $Si(OC_2D_5)_4$) deuterated ammonia $ND_3$ or deuterated dichlorosilane and nitrous oxide ($SiCl_2D_2+N_2O$). Conventional processes and other gas mixtures typically used to form various structures within the semiconductor 10 may also be used, with the exception that they contain a substantial concentration of isotopic hydrogen. In advantageous embodiments, the ordinary or nonisotopic hydrogen should not exceed 1 ppm within the gas mixture. The pressure at which the passivation occurs may be either at, above or well below atmospheric pressures, and the flow rate of the gaseous material will depend on the equipment used for depositions. These conditions combine to form a preferred formation rate that may range from about 0.01 nm to about 10.0 nm per minute. However, in more desirable embodiments, the formation rate may range from about 0.5 nm to about 3 nm.

When the dielectric structure 18 has a substantial concentration of the hydrogen isotope, it is believed that the dangling bond sites near it are occupied by the hydrogen isotope. It is further believed that this passivation greatly reduces degradation within the semiconductor device 10 because the dangling bond sites are no longer available to remove charge carriers or add unwanted charge carriers in the device. Furthermore, the hydrogen isotope may form a bond with the substrate 12 that is harder to break resulting in more reliable devices, optical or electrical. A suggested explanation why the bond is harder to break is that the hydrogen's isotopes have a heavier mass than ordinary hydrogen, which makes it more difficult to remove the isotope. Thus, the presence of the hydrogen isotope within the dielectric structure 18 offers distinct advantages over the devices of the prior art.

Also illustrated in FIG. 1 is a polysilicon structure that has been deposited, doped and etched using conventional processes to form a gate 22. The gate 22 is typically positioned over a gate oxide 24. A substantial concentration of isotopic hydrogen may also be incorporate into the gate oxide 24, if so desired. The isotope may be incorporated by thermally growing the gate oxide 24 in the presence of a hydrogen isotope steam, such as deuterium steam ($D_2O$). The other conditions and processes used to grow the gate oxide 24 are well known.

The semiconductor structure 10 may also include spacers 26 or gate side-walls that are formed around the gate 22. A hydrogen isotope may be incorporated into this structure by gaseous deposition of a silicon material containing a substantial concentration of a hydrogen isotope. The process for forming the spacers 26 are well known, with the exception, of course of the use of a gaseous material containing a substantial concentration of a hydrogen isotope. Representative examples of such deposition gases include: deuterated silane and oxygen ($SiD_4+O_2$), deuterated silane and nitrous oxide ($SiD_4+N_2O$), deuterated ammonia ($ND_3$), deuterated tetraethyl orthosilicate (TEOS, $Si(OC_2D_5)_4$), which is a more preferred embodiment or deuterated dichlorosilane and nitrous oxide ($SiCl_2D_2+N_2O$). In advantageous embodiments, the ordinary or nonisotopic hydrogen does not exceed 1 ppm within the gas mixture. In more advantageous applications, the gas mixture is injected into the deposition chamber and passivation is conducted at temperatures preferably ranging from about 150° C. to about 1100° C. The pressure at which the passivation is conducted may be either at, above or well below atmospheric pressures. The rate of deposition may also vary, depending on the desired thickness and uniformity of the layer. Deposition conditions combine to form a preferred formation rate that may range from about 0.01 nm to about 10.0 nm per minute. However, in more desirable embodiments, the formation rate may range from about 0.5 nm to about 3 nm.

When the spacers 26 have substantial concentration of the hydrogen isotope incorporated therein, it is believed that the dangling bond sites are occupied by the hydrogen isotope as previously explained. This stronger hydrogen isotope/silicon bond provides a gate that is most likely more robust and that has a substantially lower rate of degradation.

The substrate 12, oxide structures 18, gate 22, gate oxide 24 and spacers 26 provide a resulting structure that is representative of a foundational level of semiconductor processes.

Figure 2:
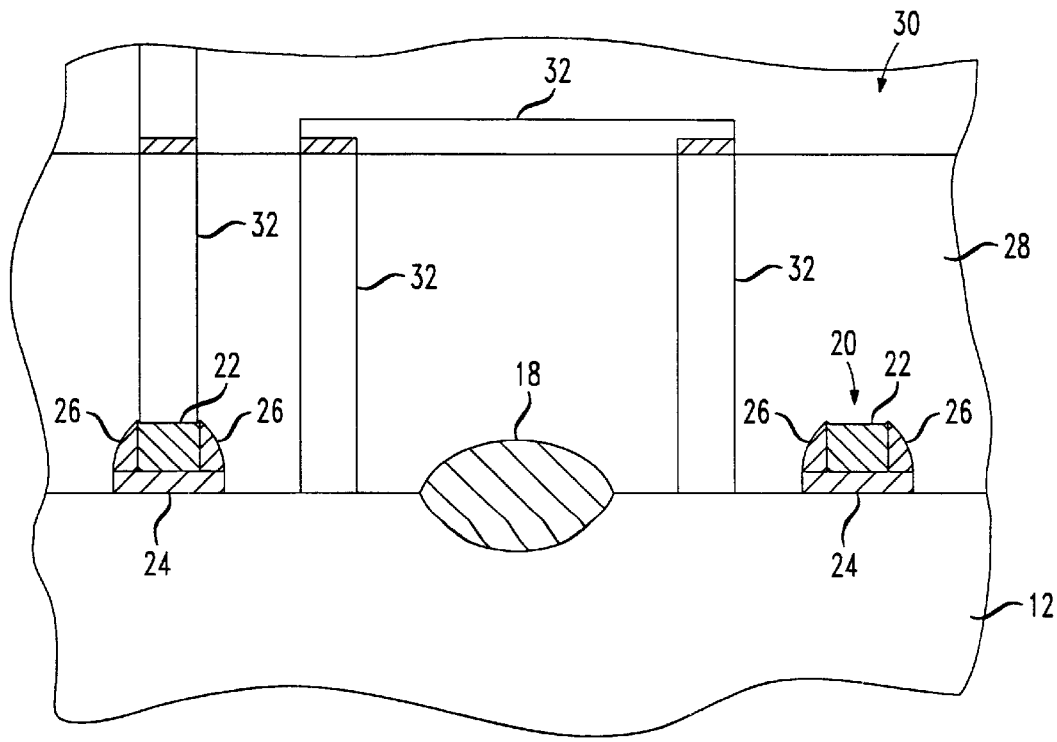
FIG. 2 illustrates a schematic cross-sectional view of the semiconductor device of FIG. 1 as included in a multi-level dielectric and metal semiconductor.

Subsequent to the formation of the gate 22 and the spacers 26, the entire foundation level may have a dielectric 28 formed over it to form a foundation for the next dielectric level 30 and metal interconnect structures 32 as schematically illustrated in FIG. 2. The dielectric 28 may be formed by conventional process with the exception that the gaseous material, such as deuterated TEOS or deuterated $SiD_4$, has a substantial concentration of a hydrogen isotope therein. As seen from FIG. 2, the present invention can be used to incorporate a hydrogen isotope into the various structures within the semiconductor 10, if so desired. When so incorporated, the hydrogen isotope provides a structure having the above-described advantages associated therewith.

Figure 3:
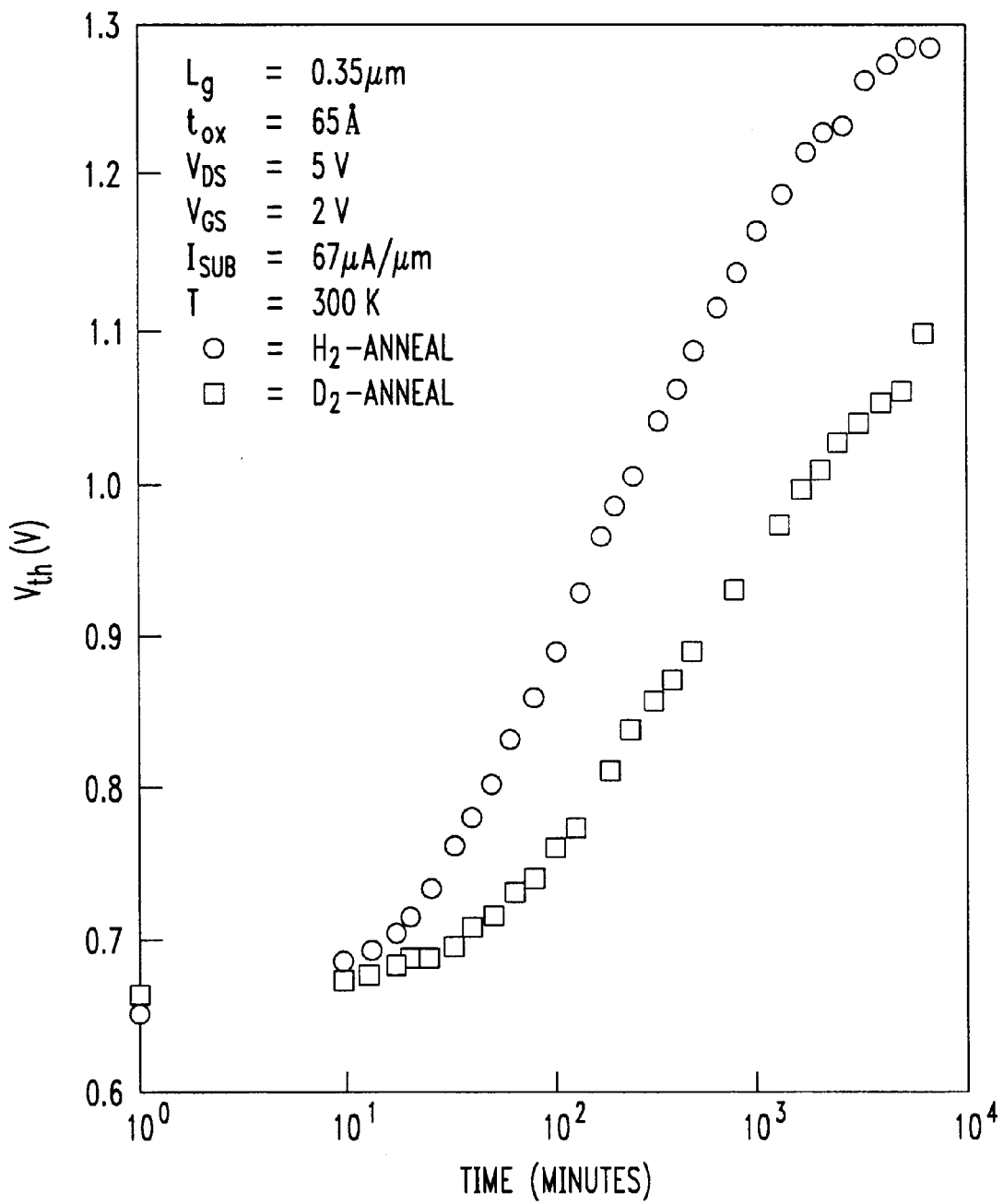
FIG. 3 illustrates a graph that shows hot carrier stress experiments conducted on a transistor at peak substrate current conditions.

FIG. 3 is a graph that illustrates hot carrier stress experiments conducted on transistors at peak substrate current conditions. The interface damage, caused by hot carriers, is observed by monitoring the change in the linear transconductance ($g_m$) and threshold voltage ($V_{th}$) of the NMOS transistor. FIG. 3 also shows the $V_{th}$ degradation as a function of stress time. As shown by the graph, the degradation of the transistor passivated with hydrogen is significantly higher than the degradation observed for the device passivated with deuterium. The threshold voltage for the deuterium passivated device increases to only about 1.05 volts over a period of $10^4$ minutes whereas at that same period of time, the threshold voltage for the hydrogen passivated device increases to 1.3 volts.

Figure 4:
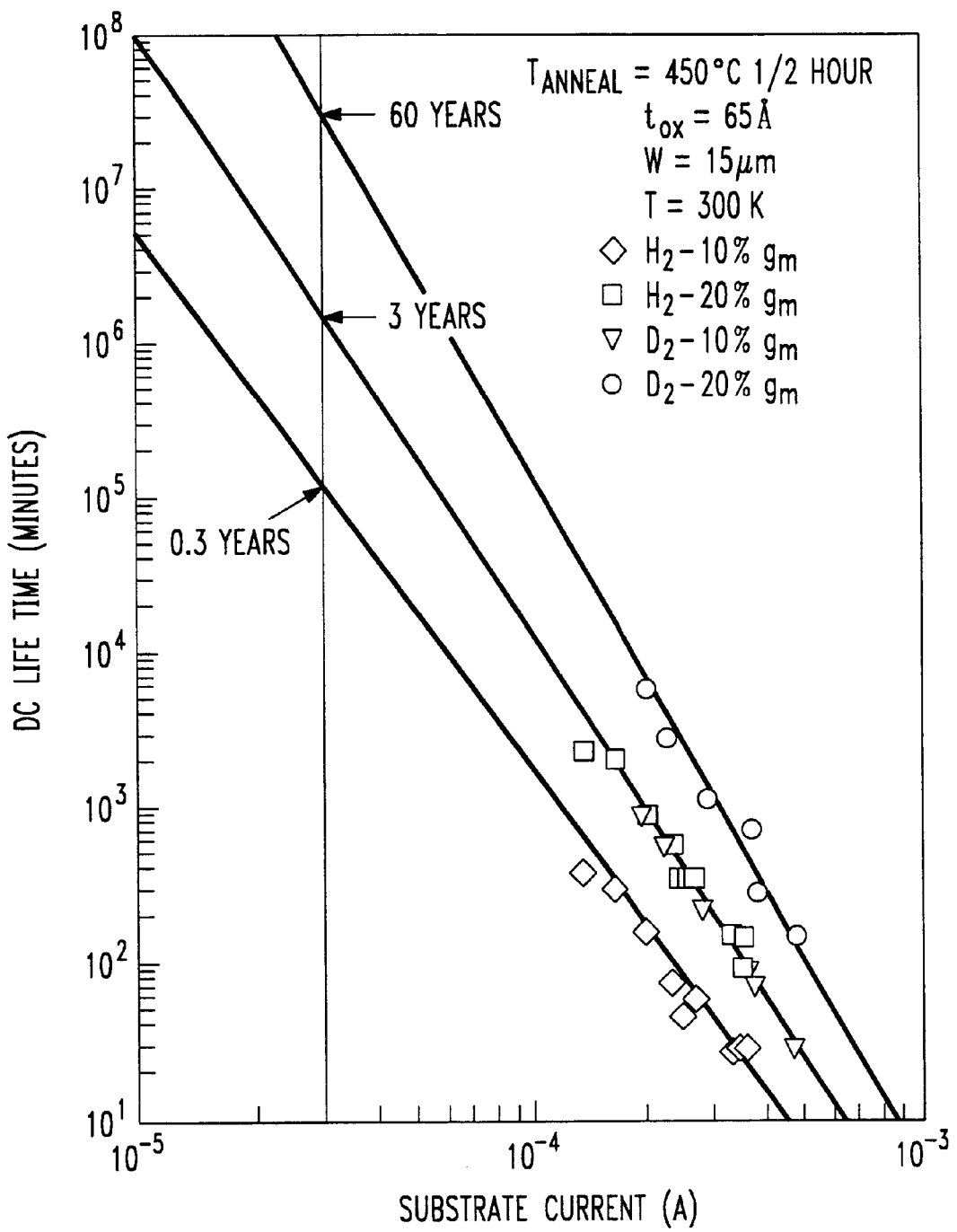
FIG. 4 illustrates a transistor lifetime versus substrate current.

FIG. 4 shows NMOS transistor lifetime versus substrate current. From this data it is evident that devices annealed in hydrogen isotopes, such as deuterium, are much more robust under channel hot electron stress. The extrapolated transistor lifetimes are indicated using various degradation criteria. The large lifetime differences between the hydrogen anneal and the deuterium anneal processes is apparent. It is noted that the substrate current specification for this technology can be increased by a factor of two while achieving equivalent hot electron degradation lifetime, when deuterium is substituted for hydrogen in the post-metal anneal process. Given the similar structures between the NMOS and the semiconductor devices covered by the present invention, it is apparent that the same results could be expected in semiconductor devices as appears in the NMOS devices.

It is believed that in the process of degradation the mass of the hydrogen or isotopic hydrogen plays a significant role and a large kinetic isotope effect is the consequence.

The foregoing has outlined, rather broadly, preferred and alternative features of the present invention so that those who are skilled in the art may better understand the detailed description of the invention that follows. Additional features of the invention that form the subject of the claims of the invention are described below. Those who are skilled in the art should appreciate that they can readily use the disclosed conception and specific embodiment as a basis for designing or modifying other structures for carrying out the same purposes of the present invention. Those who are skilled in the art should also realize that such equivalent constructions do not depart from the spirit and scope of the invention in its broadest form.

What is claimed is:

1. An improved semiconductor transistor device having a transistor gate and a film located adjacent said transistor gate and having a concentration of deuterium within said film, wherein the improvement comprises:

a concentration of at least about $10^{16}$ cm$^{-3}$ of said deuterium being present in said film, said transistor device susceptible to degradation associated with hot carrier stress, said concentration of deuterium substantially reducing said degradation associated with said hot carrier stress.

2. The device as recited in claim 1 wherein said film is selected from the group consisting of:

a dielectric film, and a polysilicon film.

3. The device as recited in claim 3 wherein said dielectric film is comprised of a material selected from the group consisting of silicon dioxide, silicon nitride, or silicon oxynitride, each of which includes a substantial concentration of a hydrogen isotope.

4. The device as recited in claim 3 wherein said polysilicon film is comprised of polycrystalline silicon.

5. The device as recited in claim 1 wherein said film is a field oxide, a gate oxide or a dielectric.

6. The device as recited in claim 6 wherein said submicron silicon transistor is selected from the group consisting of:

a complementary metal oxide semiconductor, a Bi-complementary metal oxide semiconductor, and a flash erasable programmable read only memory.

7. The device as recited in claim 1 wherein said substrate is comprised of a material selected from the group consisting of:

silicon, germanium, and gallium arsenide.

8. The device as recited in claim 1 wherein said substrate contains at least one doped region.

9. The device as recited in claim 1 further comprising a gate oxide, a field oxide or a spacer, each of which contains a substantial concentration of deuterium.

* * * * *